United States Patent
Laing et al.

(10) Patent No.: US 8,852,673 B2
(45) Date of Patent: Oct. 7, 2014

(54) DEFECT MONITORING FOR RESIST LAYER

(75) Inventors: Che-Rong Laing, Hsinchu (TW); Li-Kong Turn, Taichung (TW); Yung-Yao Lee, Zhubei (TW); Ping-Hsi Yang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 125 days.

(21) Appl. No.: 13/286,451

(22) Filed: Nov. 1, 2011

(65) Prior Publication Data

US 2013/0108775 A1    May 2, 2013

(51) Int. Cl.
 *G03F 7/26* (2006.01)
 *G03F 7/40* (2006.01)
 *G03F 7/42* (2006.01)

(52) U.S. Cl.
 CPC ... *G03F 7/26* (2013.01); *G03F 7/40* (2013.01)
 USPC .............................................. 427/8; 382/149

(58) Field of Classification Search
 CPC .......................................................... G03F 7/26
 USPC ....................... 382/149; 427/8; 430/30, 330
 See application file for complete search history.

(56) References Cited

U.S. PATENT DOCUMENTS

| | | | |
|---|---|---|---|
| 6,440,621 B1* | 8/2002 | Sutton et al. | 430/30 |
| 2003/0091942 A1* | 5/2003 | Park et al. | 430/322 |
| 2008/0076038 A1* | 3/2008 | Chang et al. | 430/5 |

FOREIGN PATENT DOCUMENTS

TW    574741    5/1991

* cited by examiner

*Primary Examiner* — Alexander Weddle
(74) *Attorney, Agent, or Firm* — Haynes and Boone, LLP (57) ABSTRACT

Methods for detecting and monitoring defects in a resist material are disclosed. In an example, a method includes forming a resist layer over a substrate; developing the resist layer; washing the developed resist layer with a thinner wash solution, wherein the washing reveals any negatively charged defects in the developed resist layer; and after the washing, inspecting for the negatively charged defects.

20 Claims, 6 Drawing Sheets

DEFECT MONITORING FOR RESIST LAYER

BACKGROUND

Integrated circuit (IC) technologies are continually progressing to smaller feature sizes, for example, down to 65 nanometers, 45 nanometers, and below. Various patterned resist layers are used to transfer a designed pattern to a wafer to form a desired IC device. For example, various resist layers may be used to form multiple material layers of the wafer that combine to form a complementary metal-oxide-semiconductor device. Sometimes, a resist material used for the various resist layers has defects that can negatively affect wafer processing. Since continued processing of wafers using a resist material having defects can result in processed wafers being scrapped, accurate, reliable, and early defect inspection of such defects is desired. Although existing resist material defect monitoring and inspection methods have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
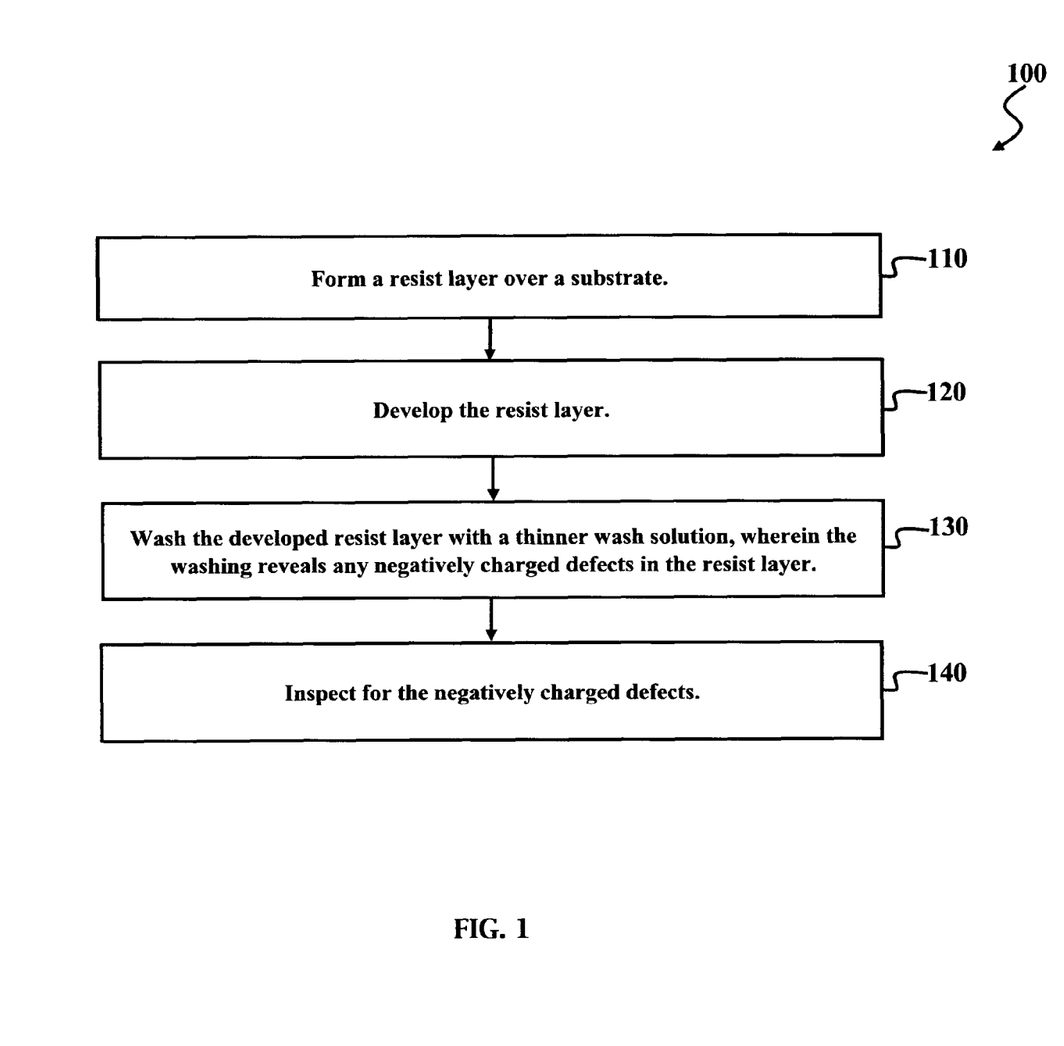
FIG. 1 is a flow chart of a method for monitoring defects in a resist material according to various aspects of the present disclosure.

FIG. 1 is a flow chart of a method for monitoring defects in a resist material according to various aspects of the present disclosure. The method 100 begins at block 110 where a resist layer is formed over a substrate. A material of the resist layer may be from a batch of resist material. At block 120, the resist layer is developed. For example, a developing solution is applied to the resist layer. The resist layer may be exposed to a baking process, such as a soft baking process, before or after the resist layer is developed. At block 130, the resist layer is washed with a thinner wash solution. The washing reveals any negatively charged defects. At block 140, an inspection process is performed that detects the negatively charged defects. The batch of resist material may be evaluated for quality based on the detected negatively charged defects. Additional steps can be provided before, during, and after the method 100, and some of the steps described can be replaced, eliminated, or moved around for additional embodiments of the method. The discussion that follows illustrates various embodiments of a resist layer that can be fabricated according to the method 100 of FIG. 1.

Figure 2:
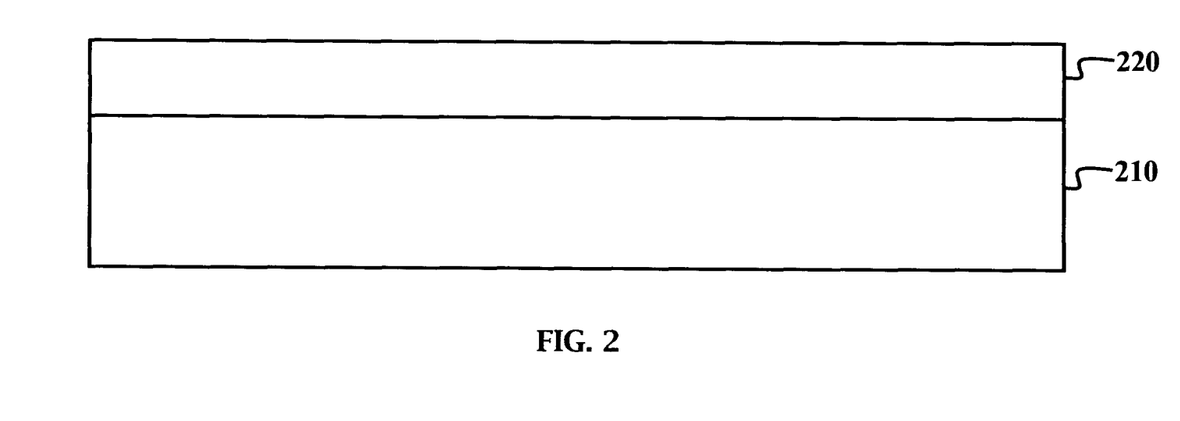
FIGS. 2-5 are various diagrammatic cross-sectional views of a resist layer during various stages of the method of FIG. 1.

FIGS. 2-5 are various diagrammatic cross-sectional views of various embodiments of a resist layer during various stages of the method 100 of FIG. 1. FIGS. 2-5 have been simplified for the sake of clarity to better understand the inventive concepts of the present disclosure. In FIG. 2, a wafer 210 is provided. The wafer 210 is a substrate (for example, a semiconductor substrate), a mask (also referred to as a photomask or reticle), or any base material on which processing may be conducted to provide layers of material to form various features of an integrated circuit (IC) device. In the depicted embodiment, the wafer 210 is a semiconductor substrate including silicon (in other words, a silicon wafer). Alternatively or additionally, the wafer 210 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the wafer 210 is a semiconductor on insulator (SOI). The wafer 210 may alternatively be referred to as a material layer, or the wafer 210 may include a material layer upon which a resist layer will be formed. In an example, the material layer is a metal layer, a semiconductor layer, or a dielectric layer. In another example, the material layer is a hard mask layer, such as a silicon oxide layer or a silicon nitride layer.

A resist layer 220 is disposed over the wafer 210. The resist layer 220 may also be referred to as a photoresist layer, photosensitive layer, imaging layer, patterning layer, or radiation sensitive layer. The resist layer 220 is formed over the wafer 210 by a suitable process, for example, by a spin-on coating technique. A rinsing process, such as a de-ionized (DI) water rinse, may be performed on the wafer 210 before forming the resist layer 220. After forming the resist layer, the resist layer 220 may be subjected to a baking process, such as a soft baking process. In the depicted embodiment, a material of the resist layer 220 is from a batch of resist material. The batch of resist material may be a fresh batch of resist material—meaning the batch of resist material has not yet been used to form resist layers for patterning various material layers. Further, in the depicted embodiment, the resist layer 220 includes positive-type resist material. Alternatively, the resist layer 220 includes negative-type resist material. The resist layer 220 has any suitable thickness. For example, the resist layer 220 has a thickness of about 10 nanometers (nm) to about 1,000 nm.

Figure 3:
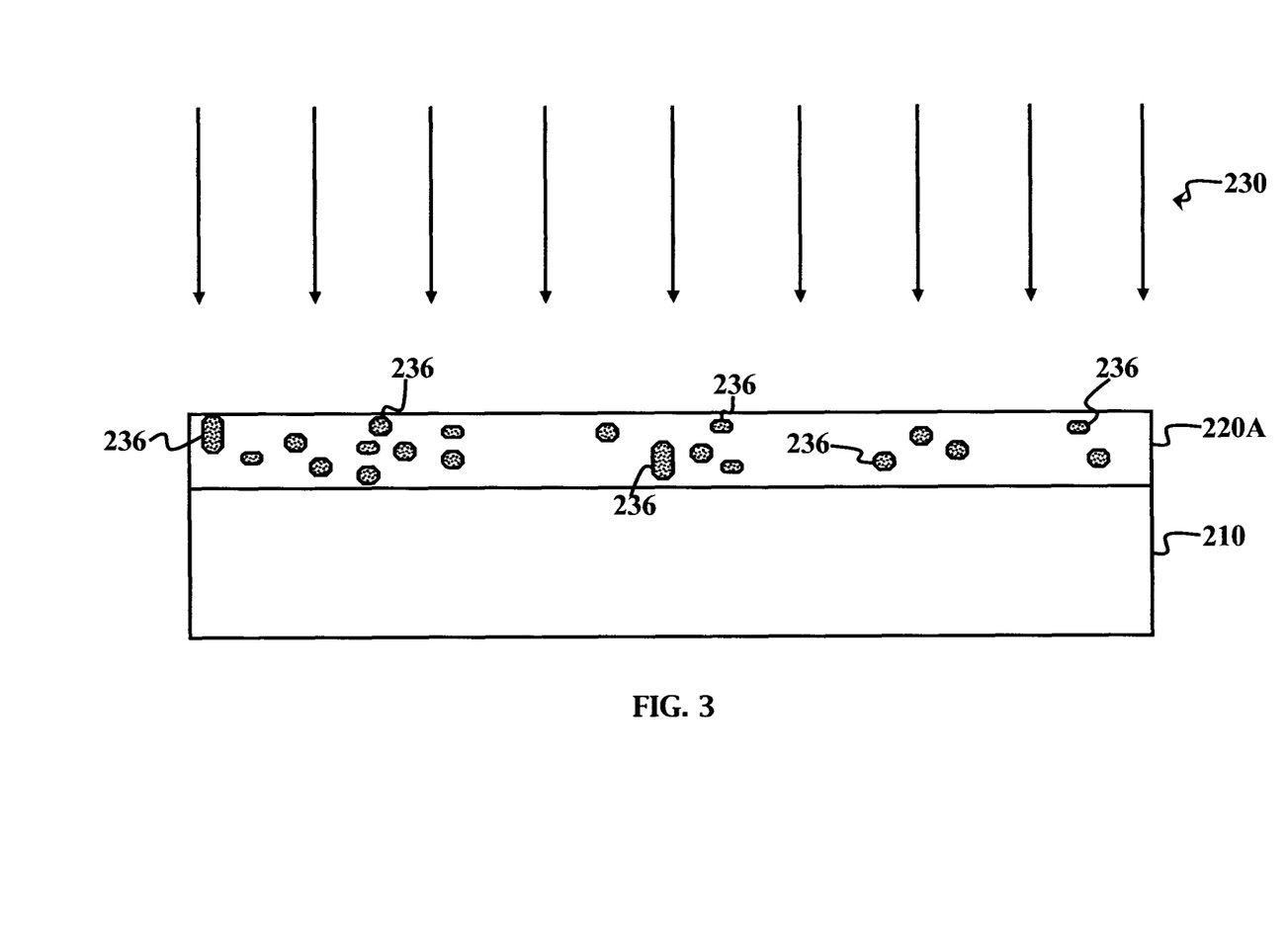

In FIG. 3, a developing process 230 is performed on the resist layer 220, thereby providing developed resist layer 220A. It is noted that, in the depicted embodiment, an exposure process is not performed before the developing process 230. During the developing process 230, a developing solution is applied to the resist layer 220. In an example, the developing solution is a basic solution, such as tetramethyl ammonium hydroxide (TMAH). Any concentration level of TMAH developer solution is utilized depending on characteristics of the resist layer 220, such as approximately 2.38% TMAH developer solution. The developed resist layer 220A includes defects 236 disposed therein. The defects 236 can be referred to as globular structures disposed within the developed resist layer 220A. In an example, the defects 236 are metal impurities disposed in the developed resist layer 220A. Such defects 236 have various sizes, such as dimensions of about 0.2 µm to about 0.5 µm. The defects 236 can cause issues when the developed resist layer 220A is stripped (removed) from the wafer 210. For example, the metal impurities may be negatively charged or neutral. Neutrally charged metal impurities typically do not affect subsequent processing, and thus, if the defects 236 are neutrally charged metal impurities, the material of the developed resist layer 220A will not present undesired issues during wafer processing. However, negatively charged metal impurities can react undesirably with etching gas used to strip (remove) the developed resist layer 220A from the wafer, and thus, if the defects 236 are negatively charged impurities, the material of the developed resist layer 220A will present undesired issues during wafer processing. More specifically, negatively charged metal impurities will attract positive metal ions to form a "double layer" structure, or zeta potential. Such "double layer" aggregates can deposit on the surface of the wafer as the developed resist layer 220A is stripped from the wafer, for example, by a plasma etching process. During the stripping, the negatively charged impurities may be removed while leaving a cluster of metal ions on the surface of the wafer, and the etching gas may react with the cluster of metal ions. For example, where a fluorine-containing etching gas is used during the plasma etching process (such as a $CF_4$ ashing process), a high concentration of the metal ions on the wafer's surface forms an extremely high local electrical field that draws flux from the negatively charged fluorine-containing etching gas. This can cause erosion, or undesired etching, of the wafer's surface. Since neutrally and negatively charged impurities react differently during subsequent processing, desirably, such defects can be detected in the material of the resist layer before the material of the resist layer is used to process one or more wafers.

Typically, when testing a batch of resist material, such defects 236 cannot be detected in an after developing inspection (ADI) (for example, inspecting the developed resist layer 220A). Instead, the defects 236 are discovered in an after etching inspection (AEI) or an after stripping inspection (ASI). In other words, the defects 236 are not discovered until after the wafer has been etched, or after the developed resist layer 220A has been removed from the wafer. The defects 236 in the resist layer are thus discovered by inspecting the wafer. Discovering the defects 236 in an AEI or an ASI typically takes longer than desirable, for example two to three days, increasing manufacturing costs and manufacturing time. Accordingly, it is desirable to not only discover such defects 236 by evaluating the resist layer itself, but also discover such defects 236 before the AEI or ASI, for example, in an ADI. The following discussion illustrates a process that can discover defects 236 in the developed resist layer 220A and can discover such defects 236 in an ADI, instead of waiting until the AEI or ASI. Different embodiments may have different advantages, and no particular advantage is necessarily required of any embodiment.

Figure 4:
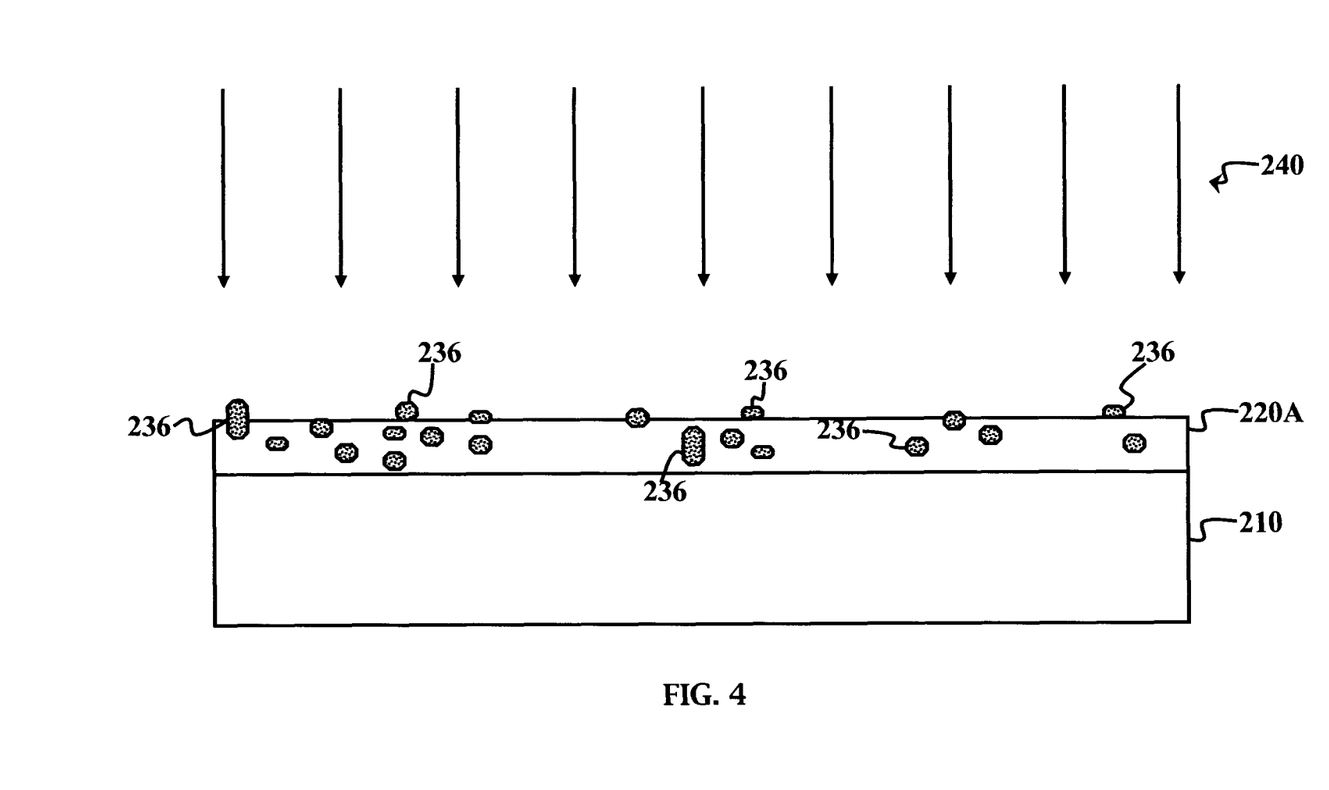

In FIG. 4, a washing process 240 is performed on the developed resist layer 220A. More specifically, the developed resist layer 220A is washed using a thinner solution. In the depicted embodiment, the thinner wash uses an organic solvent, such as OK73 thinner (manufactured by Tokyo Ohka Kogyo Co., Ltd). OK73 thinner contains propylene glycol monomethyl ether (PGME) and propylene glycol monomethyl ether acetate (PGMEA). In an example, a ratio of the PGME to PGMEA is about 3:7. The developed resist layer 220A is exposed to the thinner wash for a suitable time, for example, about 10 seconds to about 30 seconds, at a suitable temperature, for example, about 21° C. to about 25° C. If the defects 236 are neutrally charged metal impurities, the defects 236 are removed by the thinner wash. If the defects 236 are negatively charged metal impurities, the defects 236 are not removed by the thinner wash. More specifically, as noted above, negatively charged metal impurities will attract positive metal ions to form a "double layer" structure. The high local electrical field resulting from the clustered metal ions cannot be removed by the thinner wash, thus ensuring that defects 236 that have negatively charged metal impurities remain after the thinner wash is applied of the developed resist layer 220A. In the depicted embodiment, the thinner wash partially removes a portion of the developed resist layer 220A, and since the thinner wash cannot remove negatively charged metal impurities, the defects 236 will be exposed by the thinner wash if the defects 236 are negatively charged metal impurities. In an example, the thinner wash removes a thickness of the developed resist layer 220A of about 10 nm to about 1,000 nm. In another example, the thinner wash completely removes the developed resist layer 220A, and since the thinner wash cannot remove negatively charged metal impurities, the defects 236 will remain on a surface of the wafer 210 if the defects 236 are negatively charged metal impurities. Thereafter, a rinsing process, such as a de-ionized (DI) water rinse, may be performed.

Figure 5:
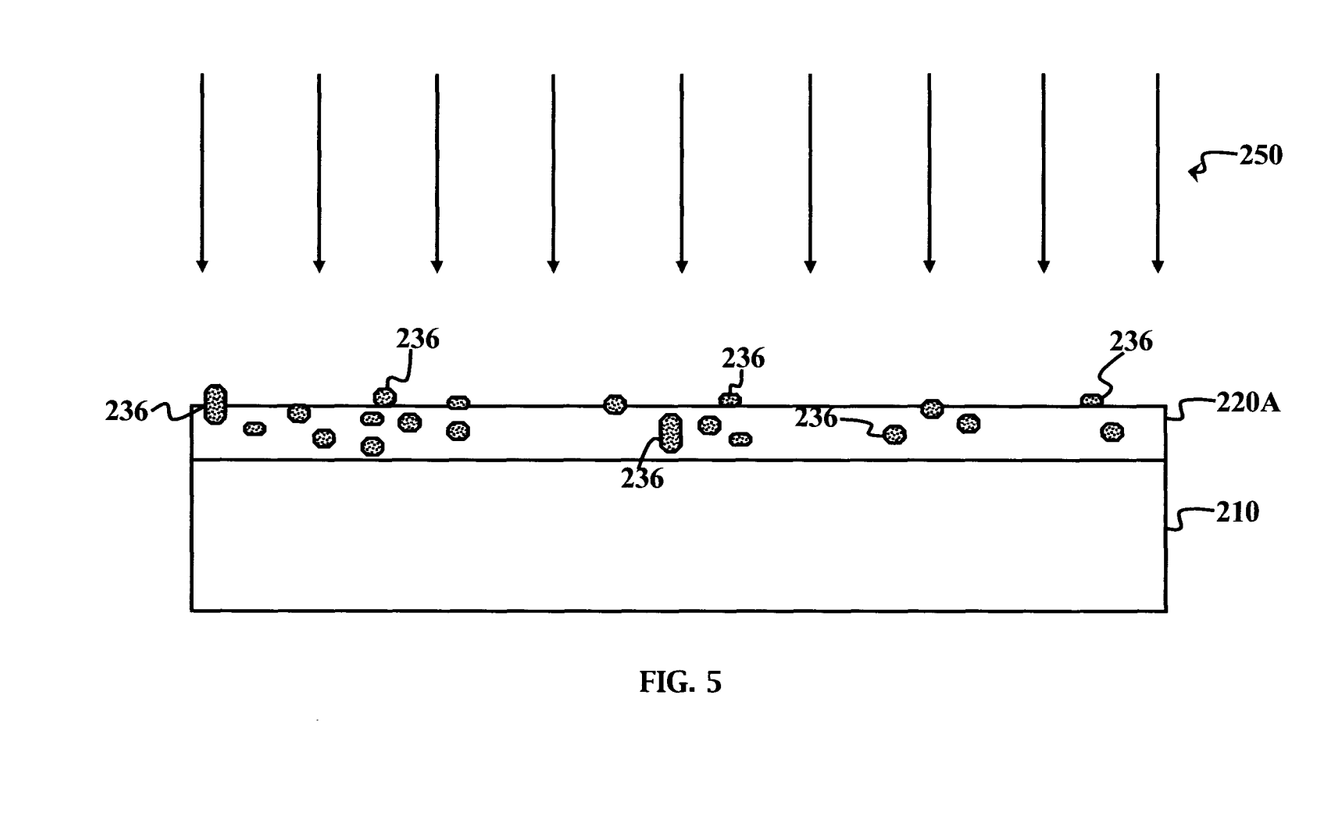
Figure 6:
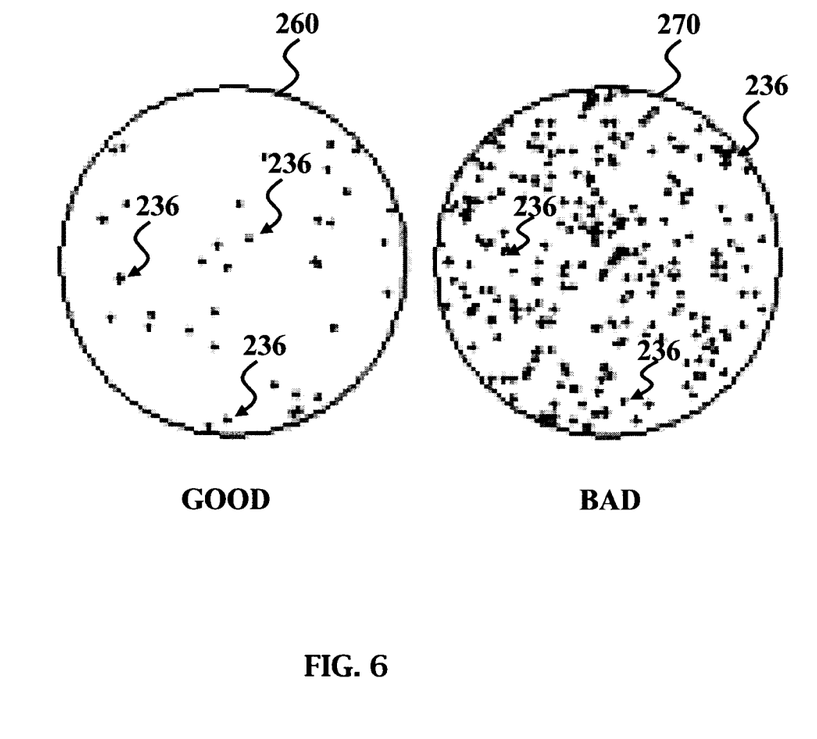
FIG. 6 is a top view of resist layers having various defects according to various aspects of the present disclosure.

In FIG. 5, an after developing inspection (ADI) 250 is performed on the developed resist layer 220A. The ADI 250 thus evaluates a surface of the developed resist layer 220A. The ADI 250 use a defect scanning tool, such as SURFSCAN SP1 and/or SURFSCAN SP2 products available from KLA-Tencore Corporation. Other defect scanning tools may also be used for the ADI 250. In situations where the thinner wash completely removes the developed resist layer 220A and the defects 236 remain on a surface of the wafer 210 if the defects 236 are negatively charged metal impurities, the ADI 250 is performed on the wafer 210 and thus evaluates a surface of the wafer 210. Because the defects 236 have been exposed by the thinner wash, the defects 236 are visible in the ADI 250. The material of the developed resist layer 220A can thus be evaluated to determine whether the resist material is a "good" batch (in other words, the resist material is a sufficient quality to use for patterning various material layers in an integrated circuit device manufacturing process) or a "bad" batch (in other words, the resist material is an insufficient quality to use for patterning various material layers in an integrated circuit device manufacturing process). In an example, the material of the developed resist layer 220A is considered a "good" batch if no defects 236 are detected in the ADI 250. In another example, the material of the developed resist layer 220A is considered a "good" batch if the amount of defects 236 detected in the ADI 250 is within an acceptable level. For example, FIG. 6 is a top view of a resist layer 260 and a resist layer 270 that have been developed and subjected to a thinner wash as described above. Though defects 236 were detected in the resist layers 260 and 270 in an ADI, the defects 236 in the resist layer 260 may be considered within an acceptable level, and the defects 236 in the resist layer 270 may be considered outside the acceptable level. The material of the resist layer 260 is thus considered a "good" batch, and the material of the resist layer 270 is considered a bad batch.

If the ADI 250 determines that the material of the developed resist layer 220A is from a "good" batch, the material can be used for processing other wafers, for example, for patterning various material layers in an integrated circuit device manufacturing process. If the ADI 250 determines that the material of the developed resist layer 220A is from a "bad" batch, the "bad" batch is discarded, thereby avoiding issues that may arise from the "bad" batch of resist material being used to process other wafers. By detecting such defects in the ADI 250, a resist material can be evaluated in a significantly faster time, for example, in three to four hours, as opposed to waiting for such evaluations in an AEI or ASI, which can take two to three days as noted above. Further, it has been observed that "good"/"bad" results found in the ADI highly correlate with the results obtained from AEI or ASI processes, and thus, the ADI provides accurate and reliable results for detecting the quality of a resist material.

Further processing can be implemented to further evaluate the quality of the material of the developed resist layer 220A. For example, the developed resist layer 220A may be used as an etching mask to etch (remove portions of) the wafer 210, and then an AEI may be performed on the developed resist layer 220A and/or wafer 210. After the wafer 210 is etched, the developed resist layer 220A is removed by a stripping process. In an example, a plasma ashing process may be used to remove the developed resist layer 220A. The plasma ashing process may use a fluorine-containing etching gas, such as $CF_4$. An ASI is then performed on the wafer 210. The AEI and ASI use a defect scanning tool, such as SURFSCAN SP1 and/or SURFSCAN SP2 products available from KLA-Tencore Corporation. Other defect scanning tools may also be used for the AEI and ASI.

The present disclosure provides for many different embodiments. In an example, a method includes forming a resist layer over a substrate; developing the resist layer; washing the developed resist layer with a thinner wash solution, wherein the washing reveals any negatively charged defects in the developed resist layer; and after the washing, inspecting for the negatively charged defects. The thinner wash solution may contain propylene glycol monomethyl ether (PGME) and propylene glycol monomethyl ether acetate (PGMEA). In an example, a ratio of the PGME to PGMEA is about 3:7. The thinner wash solution may be applied to the developed resist layer for about 10 seconds to about 30 seconds. The thinner wash solution may be applied to the developed resist layer at a temperature of about 21° C. and about 25° C. The substrate may be a silicon substrate. In an example, the washing partially removes the developed resist layer such that negatively charged defects are exposed. In another example, the washing includes removing the developed resist layer such that negatively charged defects remain on the substrate. The resist layer may be developed without performing an exposure process.

In another example, a method includes forming a resist layer over a substrate; developing the resist layer; washing the developed resist layer with a solvent that cannot remove negatively charged metal impurities in the developed resist layer; and after the washing, inspecting for the negatively charged metal impurities. The solvent may contain propylene glycol monomethyl ether (PGME) and propylene glycol monomethyl ether acetate (PGMEA). A ratio of the PGME to PGMEA may be about 3:7. The method may further include determining whether an amount of negatively charged metal impurities is within an acceptable level. A batch of resist material is used to form the resist layer, and the method may further include using the batch of resist material for processing other substrates if the amount of negatively charge metal impurities is within an acceptable level. The method may further include baking the resist layer, for example, soft baking the resist layer before developing the resist layer.

In yet another example, a method includes providing a batch of resist material; using the batch of resist material to form a resist layer of the resist material over a wafer; developing the resist layer; applying a thinner wash solution to the developed resist layer; performing an after developing inspection to determine whether the developed resist layer includes any defects; and using the batch of resist material for processing another wafer if the resist layer has an acceptable level of defects. A developing solution for developing the resist layer may include tetramethyl ammonium hydroxide (TMAH). A thinner wash solution may include propylene glycol monomethyl ether (PGME) and propylene glycol monomethyl ether acetate (PGMEA). The method may further include soft baking the resist layer before developing the resist layer. Performing the after developing inspection may include using an inspection tool that visibly scans a surface of the developed resist layer and/or using an inspection tool that visibly scans a surface of the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a resist layer over a substrate;
   developing the resist layer;
   washing the developed resist layer with a thinner wash solution, wherein the washing reveals any negatively charged defects in the developed resist layer;
   after the washing, inspecting for the negatively charged defects; and
   after inspecting for the negatively charged defects, patterning the substrate using the developed resist layer as a mask.

2. The method of claim 1 wherein the washing the developed resist layer with the thinner wash solution includes applying a solution to the developed resist layer that contains propylene glycol monomethyl ether (PGME) and propylene glycol monomethyl ether acetate (PGMEA).

3. The method of claim 2 wherein a ratio of the PGME to PGMEA is about 3:7.

4. The method of claim 1 wherein the washing the developed resist layer with the thinner wash solution includes applying the thinner wash solution to the developed resist layer for about 10 seconds to about 30 seconds.

5. The method of claim 1 wherein the washing the developed resist layer with the thinner wash solution includes applying the thinner wash solution at a temperature of about 21° C. to about 25° C.

6. The method of claim 1 wherein the inspecting for negatively charged defects includes performing an after development inspection (ADI) process.

7. The method of claim 1 wherein the washing the developed resist layer with the thinner wash solution, wherein the washing reveals any negatively charged defects in the developed resist layer, includes partially removing the developed resist layer such that negatively charged defects are exposed.

8. The method of claim 1, wherein inspecting for the negatively charged defects includes determining whether a number of the negatively charged defects in the developed resist layer is equal to or less than a predetermined number.

9. The method of claim 1, further comprising patterning a material layer over the substrate by using the patterned developed resist layer as a mask.

10. A method comprising:
forming a resist layer over a substrate;
developing the resist layer;
washing the developed resist layer with a solvent that cannot remove negatively charged metal impurities in the developed resist layer, wherein the solvent removes neutrally charged metal impurities from the developed resist layer;
after the washing, inspecting for the negatively charged metal impurities; and
after inspecting for the negatively charged metal impurities, removing a portion of the substrate using the developed resist layer as a mask.

11. The method of claim 10 wherein the washing the developed resist layer with the solvent that cannot remove negatively charged metal impurities in the developed resist layer includes applying a solution to the developed resist layer that contains propylene glycol monomethyl ether (PGME) and propylene glycol monomethyl ether acetate (PGMEA).

12. The method of claim 11 wherein a ratio of the PGME to PGMEA is about 3:7.

13. The method of claim 10 further including determining whether an amount of negatively charged metal impurities is within an acceptable level.

14. The method of claim 13:
wherein the forming the resist layer includes using a batch of resist material; and
further including using the batch of resist material for processing other substrates if the amount of negatively charged metal impurities is within the acceptable level.

15. The method of claim 10, wherein removing the portion of the substrate using the developed resist as the mask include performing an etching process to remove the portion.

16. A method comprising:
providing a batch of resist material;
using the batch of resist material to form a resist layer of the resist material over a wafer;
developing the resist layer;
applying a thinner wash solution to the developed resist layer;
performing an after developing inspection to determine whether the developed resist layer includes an acceptable level of defects;
after performing the after developing inspection, patterning the wafer using the developed resist layer as a mask; and
using the batch of resist material for processing another wafer if the resist layer has the acceptable level of defects.

17. The method of claim 16 wherein the developing the resist layer includes using a tetramethyl ammonium hydroxide (TMAH) developing solution.

18. The method of claim 16 wherein the applying the thinner wash solution includes applying a solution that contains propylene glycol monomethyl ether (PGME) and propylene glycol monomethyl ether acetate (PGMEA).

19. The method of claim 16 wherein the performing the after developing inspection includes using an inspection tool that visibly scans a surface of the developed resist layer.

20. The method of claim 16 wherein the performing the after developing inspection includes using an inspection tool that visibly scans a surface of the wafer.

* * * * *